United States Patent
Ito et al.

(10) Patent No.: US 10,153,534 B2
(45) Date of Patent: Dec. 11, 2018

(54) TRANSMISSION LINE CABLE

(71) Applicant: Murata Manufacturing Co., Ltd., Nagaokakyo-shi, Kyoto-fu (JP)

(72) Inventors: Shingo Ito, Nagaokakyo (JP); Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/465,635

(22) Filed: Mar. 22, 2017

(65) Prior Publication Data
US 2017/0194686 A1 Jul. 6, 2017

Related U.S. Application Data

(63) Continuation of application No. PCT/JP2015/080478, filed on Oct. 29, 2015.

(30) Foreign Application Priority Data

Nov. 4, 2014 (JP) .................... 2014-224204

(51) Int. Cl.
*H01P 3/08* (2006.01)
*H01P 3/02* (2006.01)
(Continued)

(52) U.S. Cl.
CPC ............. *H01P 3/026* (2013.01); *H01P 1/047* (2013.01); *H01P 3/082* (2013.01); *H01P 3/085* (2013.01);
(Continued)

(58) Field of Classification Search
CPC ............. H01P 3/08; H01P 3/082; H01P 3/085
(Continued)

(56) References Cited

U.S. PATENT DOCUMENTS 5,808,529 A * 9/1998 Hamre .................... H01P 1/047
333/238
2009/0277670 A1 11/2009 Booth, Jr. et al.
2015/0054601 A1 2/2015 Ikemoto et al.

FOREIGN PATENT DOCUMENTS

JP 05-327211 A 12/1993
JP 08-88465 A 4/1996
(Continued)

OTHER PUBLICATIONS

Official Communication issued in International Patent Application No. PCT/JP2015/080478, dated Jan. 12, 2016.

*Primary Examiner* — Stephen E. Jones
(74) *Attorney, Agent, or Firm* — Keating & Bennett, LLP

(57) ABSTRACT

A first signal conductor pattern, a first ground conductor pattern, and a second ground conductor pattern define a first transmission line with a strip line structure. A second signal conductor pattern, a third ground conductor pattern, and a fourth ground conductor pattern define a second transmission line with a strip line structure. A first connecting portion at an end of the first transmission line and a second connecting portion at an end of the second transmission line are stacked together so that the first ground conductor pattern is electrically connected to the third ground conductor pattern, the second ground conductor pattern is electrically connected to the fourth ground conductor pattern, and the first signal conductor pattern is electrically connected to the second signal conductor pattern.

20 Claims, 15 Drawing Sheets

(51) Int. Cl.
  *H01P 1/04* (2006.01)
  *H01P 5/02* (2006.01)
  *H05K 1/02* (2006.01)
  *H05K 1/14* (2006.01)
  *H01P 1/02* (2006.01)

(52) U.S. Cl.
  CPC ........... *H01P 5/028* (2013.01); *H05K 1/0245* (2013.01); *H05K 1/142* (2013.01); *H01P 1/02* (2013.01); *H05K 2201/0919* (2013.01); *H05K 2201/09845* (2013.01)

(58) Field of Classification Search
  USPC ................................................ 333/238, 246
  See application file for complete search history.

(56) References Cited

FOREIGN PATENT DOCUMENTS

| | | |
|---|---|---|
| JP | 2001-102743 A | 4/2001 |
| JP | 2007-258410 A | 10/2007 |
| WO | 2009/024565 A1 | 2/2009 |
| WO | 2014/069095 A1 | 5/2014 |
| WO | 2014/077119 A1 | 5/2014 |

\* cited by examiner

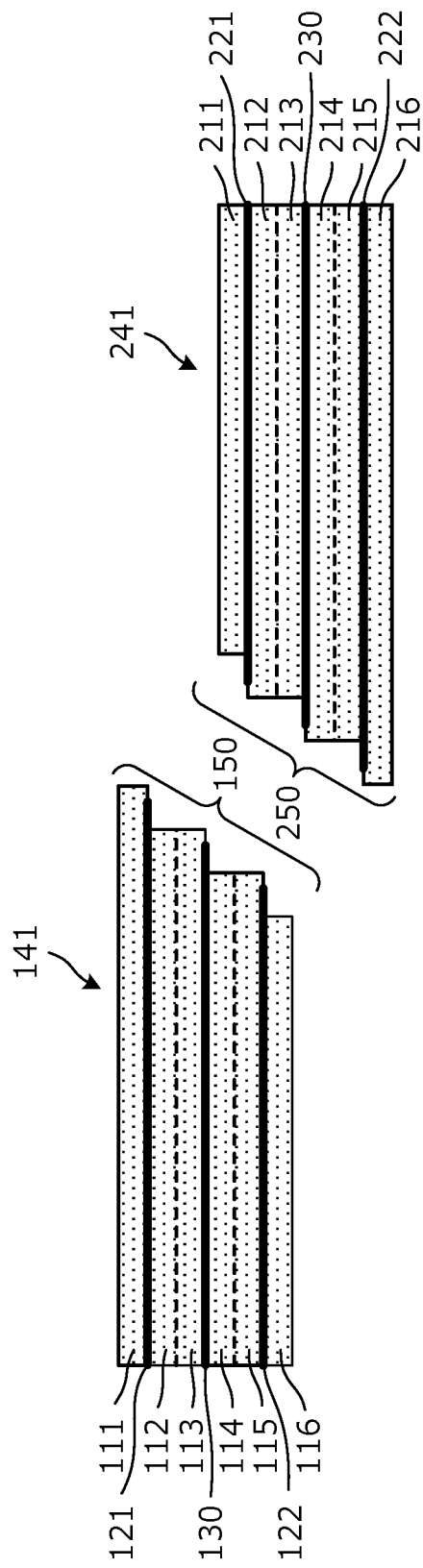

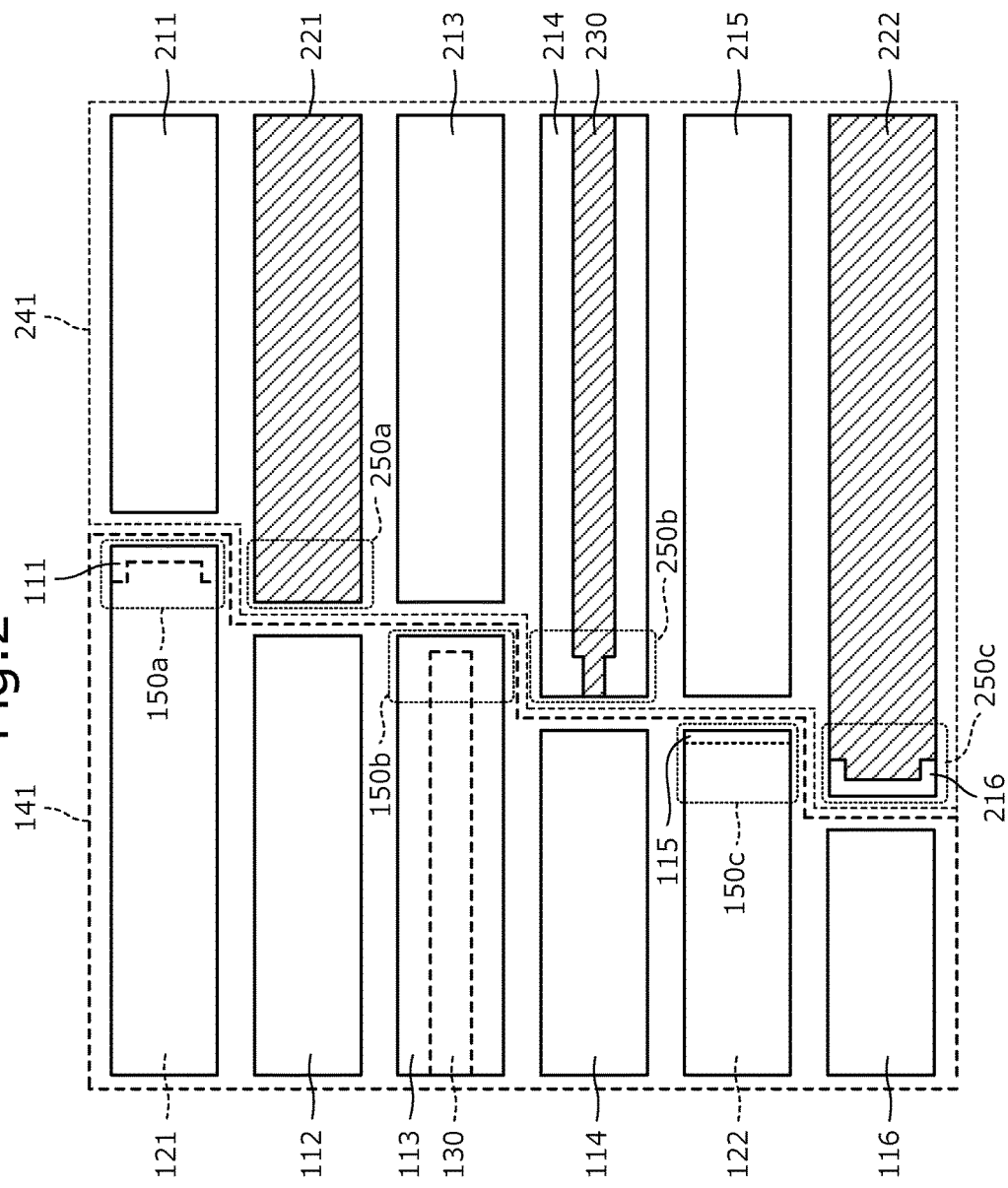

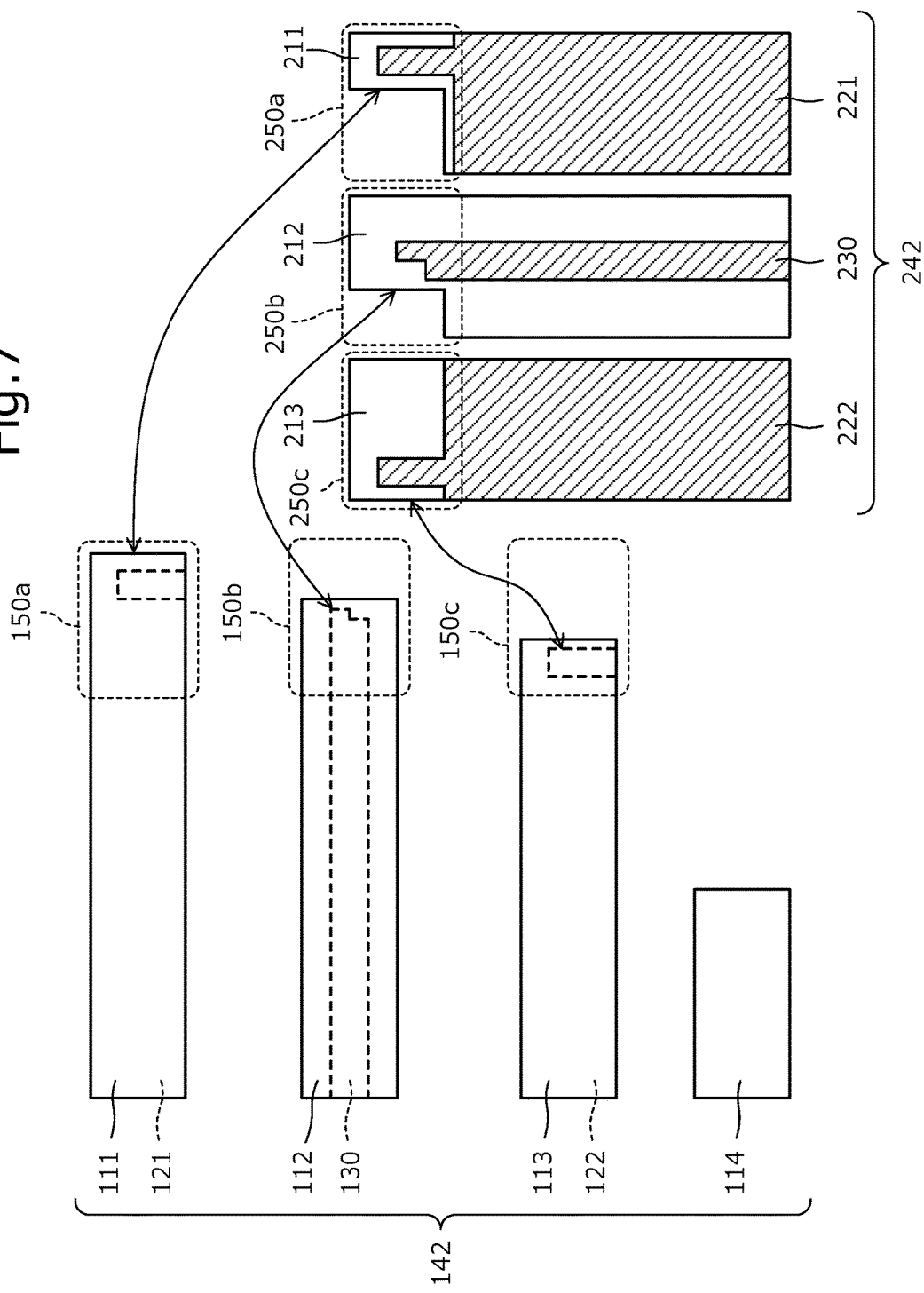

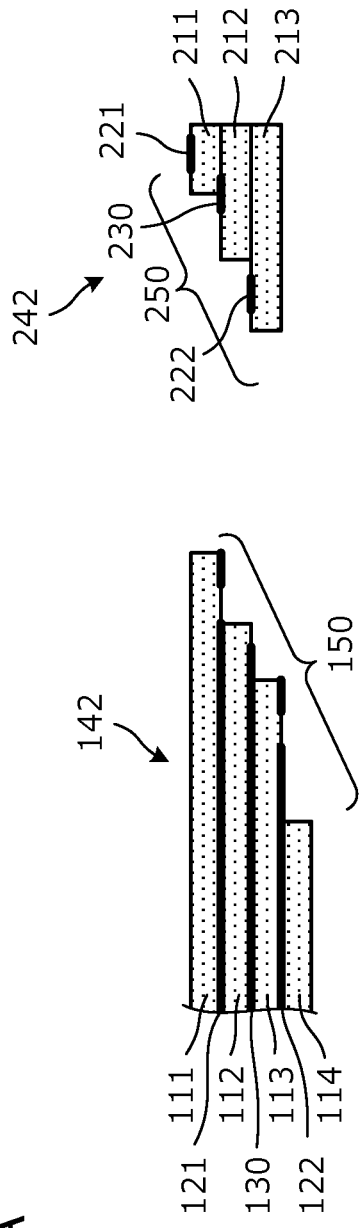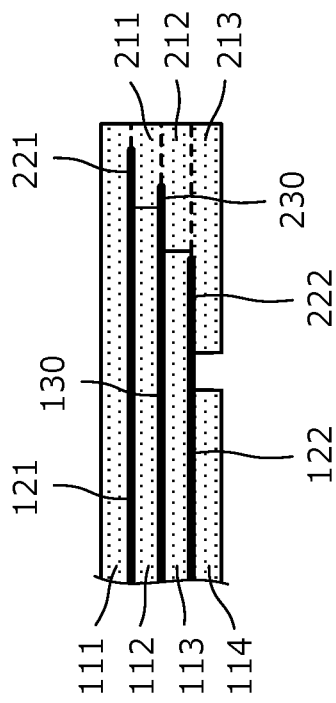
Fig. 9A
Fig. 9B

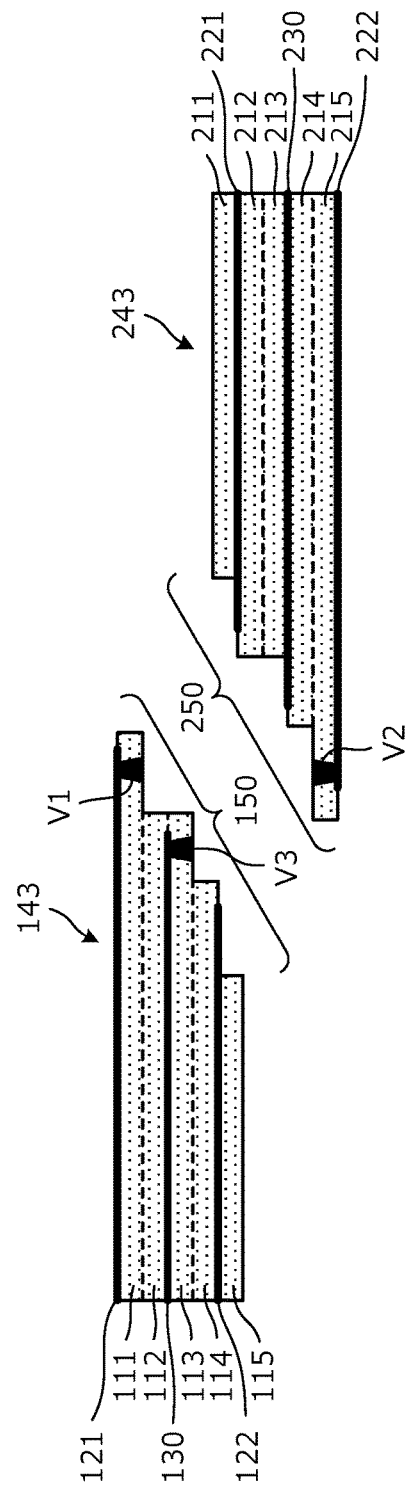
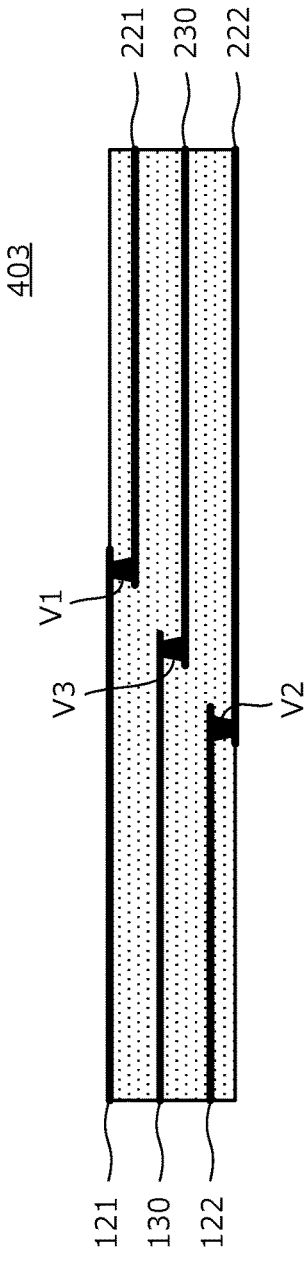
Fig. 11A
Fig. 11B

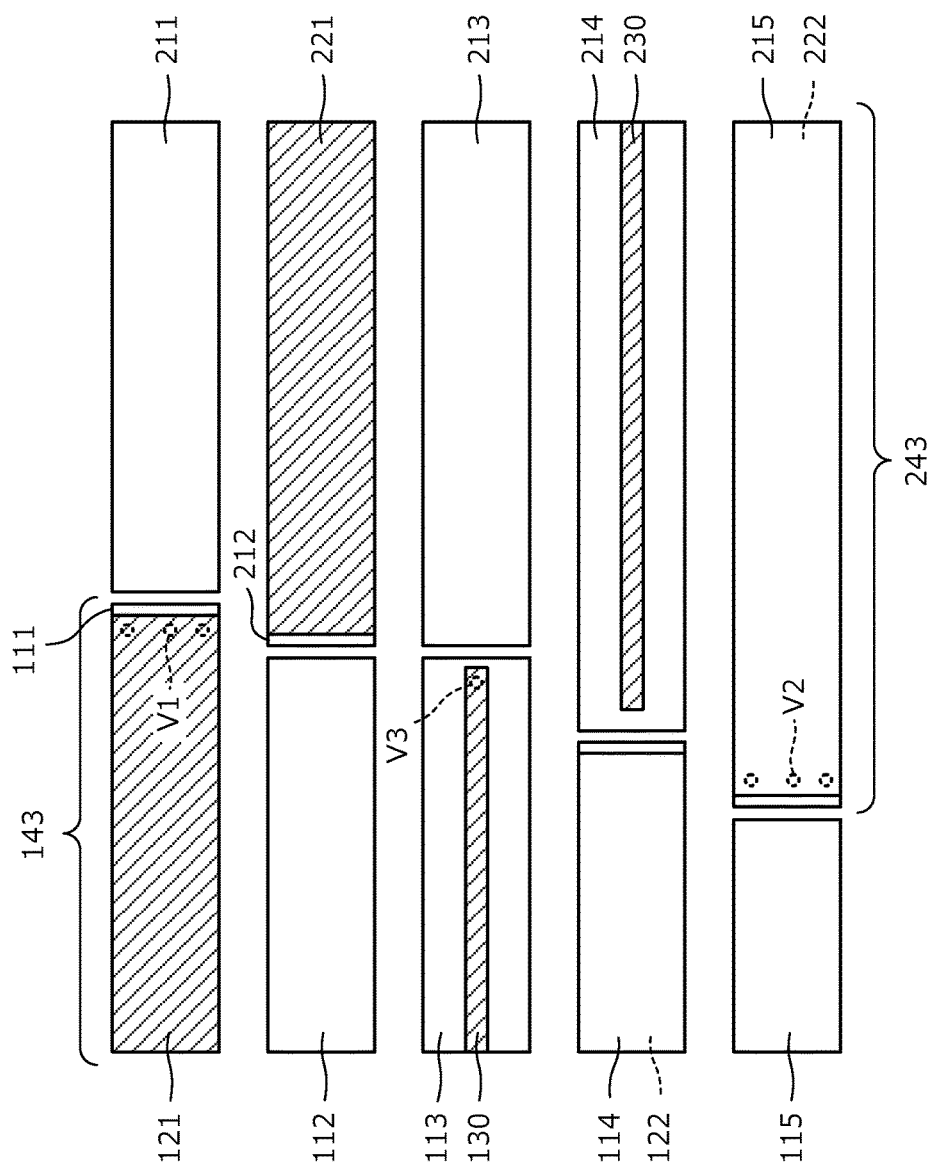

TRANSMISSION LINE CABLE

CROSS REFERENCE TO RELATED APPLICATIONS

This application claims the benefit of priority to Japanese Patent Application No. 2014-224204 filed on Nov. 4, 2014 and is a Continuation application of PCT Application No. PCT/JP2015/080478 filed on Oct. 29, 2015. The entire contents of each application are hereby incorporated herein by reference.

BACKGROUND OF THE INVENTION

1. Field of the Invention

The present invention relates to transmission line cables that transmit high-frequency signals, and more particularly, to a transmission line cable including insulator layers stacked together.

2. Description of the Related Art

Various types of transmission lines that transmit high-frequency signals have been proposed. For example, International Publication No. 2014/069095 describes a transmission line having a strip line structure. International Publication No. 2014/069095 also describes a transmission line cable formed in a predetermined shape by electrically connecting a plurality of transmission lines.

FIG. 15 is a sectional view of a portion of a transmission line cable in which two transmission lines 140 and 240 are connected. The transmission line cable according to International Publication No. 2014/069095 is obtained by connecting the two transmission lines 140 and 240. The first transmission line 140 includes a first ground conductor pattern 121, a second ground conductor pattern, which does not appear in the sectional view of FIG. 15, and a first signal conductor pattern 130. The second transmission line 240 includes a third ground conductor pattern 221, a fourth ground conductor pattern 222, and a second signal conductor pattern 230. When the two transmission lines 140 and 240 are connected to each other, the first signal conductor pattern 130 and the second signal conductor pattern 230 are electrically connected to each other. In addition, the first ground conductor pattern 121 and the fourth ground conductor pattern 222 are electrically connected to each other.

In the structure illustrated in FIG. 15, the first ground conductor pattern 121 of the first transmission line 140 and the third ground conductor pattern 221 of the second transmission line 240 have a discontinuous portion between them, as indicated by the ellipse in FIG. 15. Therefore, there is a risk of unnecessary radiation from this section.

SUMMARY OF THE INVENTION

Preferred embodiments of the present invention provide a transmission line cable in which ground conductor patterns included in two transmission lines do not have a discontinuous portion in the connecting section between the two transmission lines so that the above-described problem does not occur.

A transmission line cable according to a preferred embodiment of the present invention includes a first transmission line and a second transmission line. The first transmission line includes a first multilayer insulator and first conductor patterns. The first multilayer insulator includes a plurality of insulator layers that are stacked together. The first conductor patterns are disposed in or on the first multilayer insulator and extend along the insulator layers of the first multilayer insulator. The second transmission line includes a second multilayer insulator and second conductor patterns. The second multilayer insulator includes a plurality of insulator layers that are stacked together. The second conductor patterns are disposed in or on the second multilayer insulator and extend along the insulator layers of the second multilayer insulator. The first conductor patterns include a first ground conductor pattern, a second ground conductor pattern, and a first signal conductor pattern disposed between the first ground conductor pattern and the second ground conductor pattern in a stacking direction. The second conductor patterns include a third ground conductor pattern, a fourth ground conductor pattern, and a second signal conductor pattern disposed between the third ground conductor pattern and the fourth ground conductor pattern in the stacking direction. In a first connecting portion of the first transmission line that is connected to the second transmission line, the first signal conductor pattern projects beyond the second ground conductor pattern in a direction in which the first signal conductor pattern extends, and the first ground conductor pattern projects beyond the first signal conductor pattern and the second ground conductor pattern in a direction in which the first ground conductor pattern extends. In a second connecting portion of the second transmission line that is connected to the first transmission line, the second signal conductor pattern projects beyond the third ground conductor pattern in a direction in which the second signal conductor pattern extends, and the fourth ground conductor pattern projects beyond the second signal conductor pattern and the third ground conductor pattern in a direction in which the fourth ground conductor pattern extends. In a state in which the first connecting portion and the second connecting portion are stacked together, the first ground conductor pattern is electrically connected to the third ground conductor pattern, the second ground conductor pattern is electrically connected to the fourth ground conductor pattern, and the first signal conductor pattern is electrically connected to the second signal conductor pattern. In the state in which the first connecting portion and the second connecting portion are stacked together, the first signal conductor pattern and the second signal conductor pattern are disposed between a pair of ground conductor patterns defined by the first ground conductor pattern and the third ground conductor pattern and a pair of ground conductor patterns defined by the second ground conductor pattern and the fourth ground conductor pattern in the stacking direction.

According to the above-described structure of a preferred embodiment of the present invention, the first ground conductor pattern and the second ground conductor pattern of the first transmission line are respectively electrically connected to the third ground conductor pattern and the fourth ground conductor pattern of the second transmission line, so that the ground conductor patterns do not have a discontinuous portion. Therefore, unnecessary radiation from the discontinuous portion does not occur.

Preferably, a region in which the first signal conductor pattern and the second signal conductor pattern are electrically connected to each other overlaps at least one of the first ground conductor pattern, the second ground conductor pattern, the third ground conductor pattern, and the fourth ground conductor pattern in plan view. In this case, the region in which the first signal conductor pattern and the second signal conductor pattern are electrically connected to each other is shielded by the ground conductor patterns, so that unnecessary radiation therefrom is significantly reduced or prevented.

A width of the first signal conductor pattern in the first connecting portion preferably differs from a width of the second signal conductor pattern in the second connecting portion. In this case, even when the first signal conductor pattern and the second signal conductor pattern are displaced relative to each other, the opposing area in which they oppose the ground conductor patterns is constant. As a result, stable characteristics are obtained.

A width of the first ground conductor pattern in the first connecting portion preferably differs from a width of the third ground conductor pattern in the second connecting portion, and a width of the second ground conductor pattern in the first connecting portion differs from a width of the fourth ground conductor pattern in the second connecting portion. In this case, even when the first ground conductor pattern and the third ground conductor pattern are displaced relative to each other, the first ground conductor pattern and the third ground conductor pattern have a constant width (continuity is maintained), so that stable characteristics are able to be obtained. Similarly, even when the second ground conductor pattern and the fourth ground conductor pattern are displaced relative to each other, the second ground conductor pattern and the fourth ground conductor pattern have a constant width, so that stable characteristics are able to be obtained.

A planar shape of the first signal conductor pattern in the first connecting portion and a planar shape of the second signal conductor pattern in the second connecting portion preferably fit each other, and a gap between the first signal conductor pattern and the second signal conductor pattern is filled with a conductor. According to this structure, the area in which the first signal conductor pattern and the signal conductor pattern overlap is reduced, so that an increase in the thickness at the first and second connecting portions is able to be reduced or prevented.

A planar shape of the first ground conductor pattern in the first connecting portion and a planar shape of the third ground conductor pattern in the second connecting portion preferably fit each other, and a gap between the first ground conductor pattern and the third ground conductor pattern is filled with a conductor. In addition, a planar shape of the second ground conductor pattern in the first connecting portion and a planar shape of the fourth ground conductor pattern in the second connecting portion preferably fit each other, and a gap between the second ground conductor pattern and the fourth ground conductor pattern is filled with a conductor.

According to the above-described structure of a preferred embodiment of the present invention, the area in which the first ground conductor pattern and the third ground conductor pattern overlap is reduced, and the area in which the second ground conductor pattern and the fourth ground conductor pattern overlap is reduced. Therefore, an increase in the thickness at the first and second connecting portions is able to be reduced or prevented.

At least one of an electrical connection between the first ground conductor pattern and the third ground conductor pattern, an electrical connection between the second ground conductor pattern and the fourth ground conductor pattern, and an electrical connection between the first signal conductor pattern and the second signal conductor pattern is preferably provided by an interlayer connection conductor.

According to the above-described structure of a preferred embodiment of the present invention, the thickness is able to be reduced by an amount corresponding to the thickness of a conductive joining material, such as solder. Therefore, an increase in the thickness at the first and second connecting portions is able to be reduced or prevented.

The insulator layers are preferably made of a thermoplastic resin, and are fusion-bonded in the state in which the first connecting portion and the second connecting portion are stacked together. According to this structure, the transmission line cable has a sufficient strength in the region where the first connecting portion and the second connecting portion are stacked together (joining region).

According to preferred embodiments of the present invention, the first ground conductor pattern and the second ground conductor pattern of the first transmission line are respectively electrically connected to the third ground conductor pattern and the fourth ground conductor pattern of the second transmission line, so that the ground conductor patterns do not have a discontinuous portion. Therefore, unnecessary radiation from the discontinuous portion does not occur.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a sectional view of a first transmission line 141 and a second transmission line 241 included in a transmission line cable according to a first preferred embodiment of the present invention.

FIG. 2 is a development plan view of layers included in the first transmission line 141 and the second transmission line 241.

FIG. 7 is a development plan view of layers included in a first transmission line 142 and a second transmission line 242, which are included in a transmission line cable according to a second preferred embodiment of the present invention.

FIGS. 9A and 9B are sectional views of the transmission line cable including the first transmission line 142 and the second transmission line 242.

FIGS. 11A and 11B are sectional views of a first transmission line 143 and a second transmission line 243, which are included in a transmission line cable according to a third preferred embodiment of the present invention.

FIG. 12 is a development plan view of layers included in the first transmission line 143 and the second transmission line 243.

DETAILED DESCRIPTION OF THE PREFERRED EMBODIMENTS

Figure 3A:
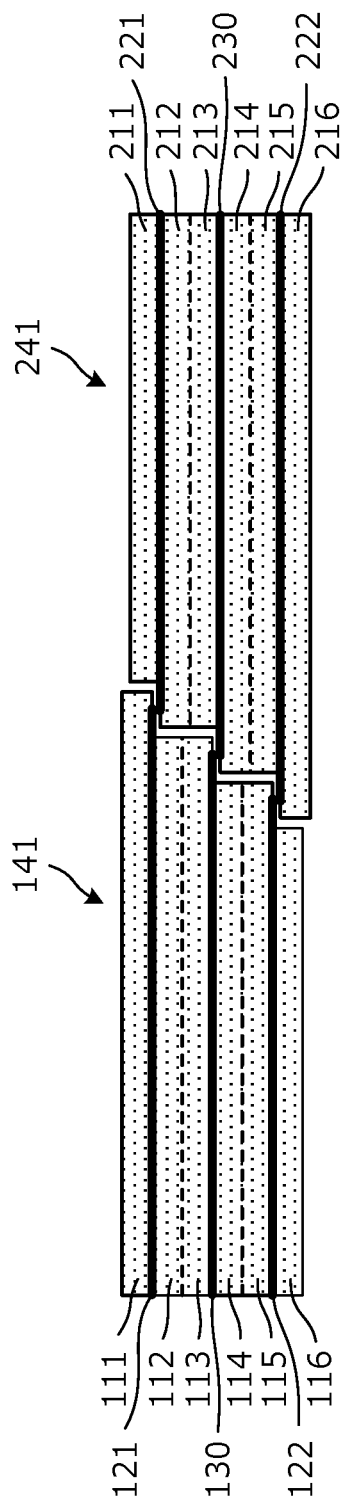
FIGS. 3A and 3B are sectional views of a transmission line cable 401 including the first transmission line 141 and the second transmission line 241.

Preferred embodiments of the present invention will be described by giving specific examples with reference to the drawings. In the drawings, like elements and features are denoted by like symbols. In the second and following preferred embodiments, description of matters that are the same as those in the first preferred embodiment will be omitted for the sake of brevity, and the differences will be described. In particular, description of similar effects achieved by similar structures will not be repeated in each preferred embodiment.

First Preferred Embodiment

Figure 3B:
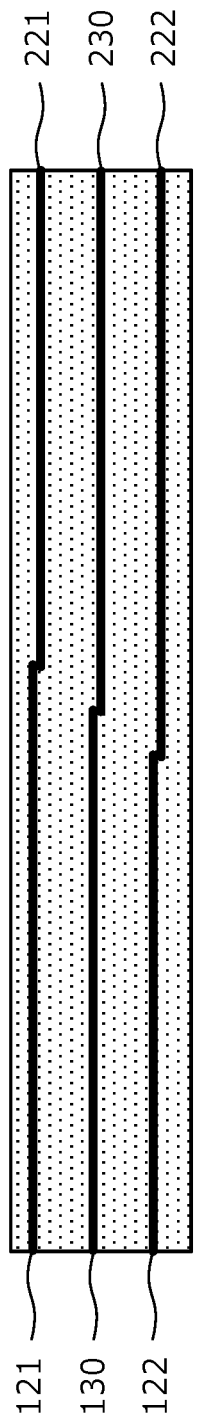

FIG. 1 is a sectional view of a first transmission line 141 and a second transmission line 241 included in a transmission line cable according to a first preferred embodiment of the present invention. FIG. 2 is a development plan view of layers included in the first transmission line 141 and the second transmission line 241. FIGS. 3A and 3B are sectional views of a transmission line cable 401 including the first transmission line 141 and the second transmission line 241.

The first transmission line 141 includes a first multilayer insulator preferably including insulator layers 111, 112, 113, 114, 115, and 116 that are stacked together, and first conductor patterns that extend along the insulator layers of the first multilayer insulator. More specifically, a first ground conductor pattern 121 is provided on the insulator layer 111, a second ground conductor pattern 122 is provided on the insulator layer 115, and a first signal conductor pattern 130 is provided on the insulator layer 113. The first conductor patterns preferably include the first ground conductor pattern 121, the second ground conductor pattern 122, and the first signal conductor pattern 130. The insulator layer 112 is disposed between the insulator layers 111 and 113, and the insulator layer 114 is disposed between the insulator layers 113 and 115. The insulator layer 116 is disposed below the insulator layer 115.

Similar to the first transmission line 141, the second transmission line 241 preferably includes a second multilayer insulator including insulator layers 211, 212, 213, 214, 215, and 216 that are stacked together, and second conductor patterns that extend along the insulator layers of the second multilayer insulator. More specifically, a third ground conductor pattern 221 is provided on the insulator layer 212, a second ground conductor pattern 222 is provided on the insulator layer 216, and a second signal conductor pattern 230 is provided on the insulator layer 214. The second conductor patterns preferably include the third ground conductor pattern 221, the fourth ground conductor pattern 222, and the second signal conductor pattern 230. The insulator layer 215 is disposed between the insulator layers 216 and 214, and the insulator layer 213 is disposed between the insulator layers 214 and 212. The insulator layer 211 is disposed above the insulator layer 212.

The first transmission line 141 includes a first connecting portion 150 that is connected to the second transmission line 241. The second transmission line 241 includes a second connecting portion 250 that is connected to the first transmission line 141.

In the first connecting portion 150, the first signal conductor pattern 130 projects beyond the second ground conductor pattern 122, and the first ground conductor pattern 121 projects beyond the first signal conductor pattern 130 and the second ground conductor pattern 122.

In the second connecting portion 250, the second signal conductor pattern 230 projects beyond the third ground conductor pattern 221, and the fourth ground conductor pattern 222 projects beyond the second signal conductor pattern 230 and the third ground conductor pattern 221.

Thus, the first connecting portion 150 and the second connecting portion 250 preferably both have a stepped shape.

Each of the insulator layers 111 to 116 and 211 to 216 is preferably a thermoplastic resin sheet made of, for example, liquid crystal polymer (LCP) or polyimide (PI).

In the first connecting portion 150, a conductive joining material containing low-melting-point metal powder or solder paste is applied to exposed portions of the first ground conductor pattern 121, the second ground conductor pattern 122, and the first signal conductor pattern 130. Similarly, in the second connecting portion 250, a conductive joining material including low-melting-point metal powder or solder paste is applied to exposed portions of the third ground conductor pattern 221, the fourth ground conductor pattern 222, and the second signal conductor pattern 230.

The conductive joining material containing low-melting-point metal powder (conductive joining material paste) is preferably, for example, paste containing low-melting-point metal powder (Sn) and alloy powder (Cu—Ni alloy or Cu—Mn alloy) that is capable of forming an intermetallic compound together with the low-melting-point metal powder at a temperature higher than or equal to the melting temperature of the low-melting-point metal powder. This paste solidifies without being melted when heated.

FIG. 3A is a sectional view illustrating the first transmission line 141 and the second transmission line 241 before they are joined together (when they are simply stacked), and FIG. 3B illustrates the first transmission line 141 and the second transmission line 241 after they are joined together. The first connecting portion 150 of the first transmission line 141 and the second connecting portion 250 of the second transmission line 241 are stacked together, and are heated and pressurized. As a result, as illustrated in FIG. 3B, the first connecting portion 150 and the second connecting portion 250 of the first transmission line 141 and the second transmission line 241, respectively, are stacked together in such a state that the first ground conductor pattern 121 is electrically connected to the third ground conductor pattern 221, the second ground conductor pattern 122 is electrically connected to the fourth ground conductor pattern 222, and the first signal conductor pattern 130 is electrically connected to the second signal conductor pattern 230.

When the conductive joining material paste is heated to a temperature higher than or equal to the melting temperature of the low-melting-point metal powder (higher than or equal to about 230° C.), Sn and Cu—Ni (or Cu—Mn) react with each other to form an intermetallic compound. The intermetallic compound preferably has a melting temperature of higher than or equal to about 400° C., for example.

According to the above-described structure, the first signal conductor pattern 130, the first ground conductor pattern 121, and the second ground conductor pattern 122 define the first transmission line, which has a strip line structure. In addition, the second signal conductor pattern 230, the third ground conductor pattern 221, and the fourth ground conductor pattern 222 define the second transmission line, which also has a strip line structure. When components other than conductors are included, not only the first signal conductor pattern 130, the first ground conductor pattern 121, and the second ground conductor pattern 122 but also the insulator layers 112, 113, 114, and 115, which define and function as dielectrics and support layers, are the components of the first transmission line. Similarly, not only the second signal conductor pattern 230, the third ground conductor pattern 221, and the fourth ground conductor pattern 222 but also the insulator layers 212, 213, 214, are 215 are the components of the second transmission line.

According to the present preferred embodiment, the ground conductor patterns do not have a discontinuous portion. Therefore, unnecessary radiation from the discontinuous portion does not occur. The region in which the first signal conductor pattern 130 and the second signal conductor pattern 230 are electrically connected to each other overlaps the first ground conductor pattern 121 and the fourth ground conductor pattern 222 in plan view. Thus, the region in which the first signal conductor pattern 130 and the second signal conductor pattern 230 are electrically connected to each other is shielded by the ground conductor patterns, so that unnecessary radiation therefrom is reduced or prevented.

The region in which the first signal conductor pattern 130 and the second signal conductor pattern 230 are electrically connected to each other may overlap the second ground conductor pattern 122 or the third ground conductor pattern 221 instead of overlapping the first ground conductor pattern 121 and the fourth ground conductor pattern 222 in plan view. Also in this case, the region in which the first signal conductor pattern and the second signal conductor pattern are electrically connected to each other is electromagnetically shielded by the ground conductor patterns, so that unnecessary radiation therefrom is reduced or prevented.

Figure 4A:
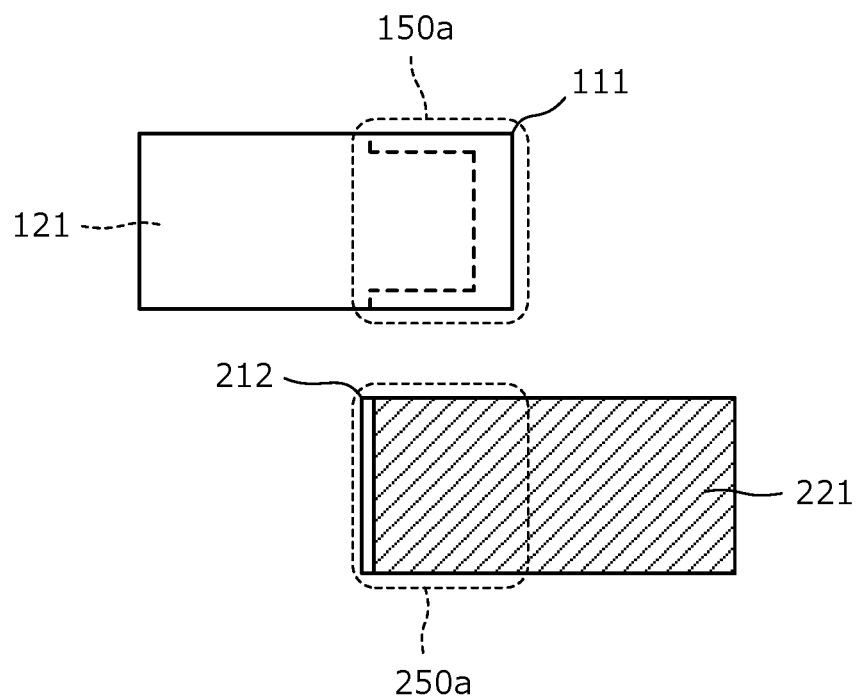
FIG. 4A is a plan view illustrating the shape of a first ground conductor pattern 121 in a first connecting portion 150*a* and the shape of a third ground conductor pattern 221 in a second connecting portion 250*a*.
Figure 4B:
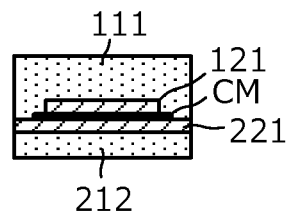
FIG. 4B is a sectional view of the first connecting portion 150*a* and the second connecting portion 250*a*.

FIG. 4A is a plan view illustrating the shape of the first ground conductor pattern 121 in a first connecting portion 150a and the shape of the third ground conductor pattern 221 in a second connecting portion 250a. FIG. 4B is a sectional view of the first connecting portion 150a and the second connecting portion 250a. The first ground conductor pattern 121 and the third ground conductor pattern 221 are joined together by a conductive joining material CM.

The width of the first ground conductor pattern 121 in the first connecting portion 150a is preferably smaller than the width of the third ground conductor pattern 221 in the second connecting portion 250a. Therefore, even when the first ground conductor pattern 121 and the third ground conductor pattern 221 are displaced relative to each other (the displacement depends on the accuracies by which the conductor patterns are made and the insulator layers are stacked together), the first ground conductor pattern and the third ground conductor pattern have a constant width. As a result, stable characteristics are able to be obtained.

As illustrated in FIG. 2, the width of the fourth ground conductor pattern 222 in a second connecting portion 250c is preferably smaller than the width of the second ground conductor pattern 122 in a first connecting portion 150c. Therefore, even when the second ground conductor pattern 122 and the fourth ground conductor pattern 222 are displaced relative to each other, the second ground conductor pattern and the fourth ground conductor pattern have a constant width. As a result, stable characteristics are able to be obtained.

As illustrated in FIG. 2, the width of the second signal conductor pattern 230 in a second connecting portion 250b is preferably smaller than the width of the first signal conductor pattern 130 in a first connecting portion 150b. Therefore, even when the first signal conductor pattern 130 and the second signal conductor pattern 230 are displaced relative to each other, the opposing area in which they oppose the ground conductor patterns is constant. As a result, stable characteristics are able to be obtained.

Figure 5:
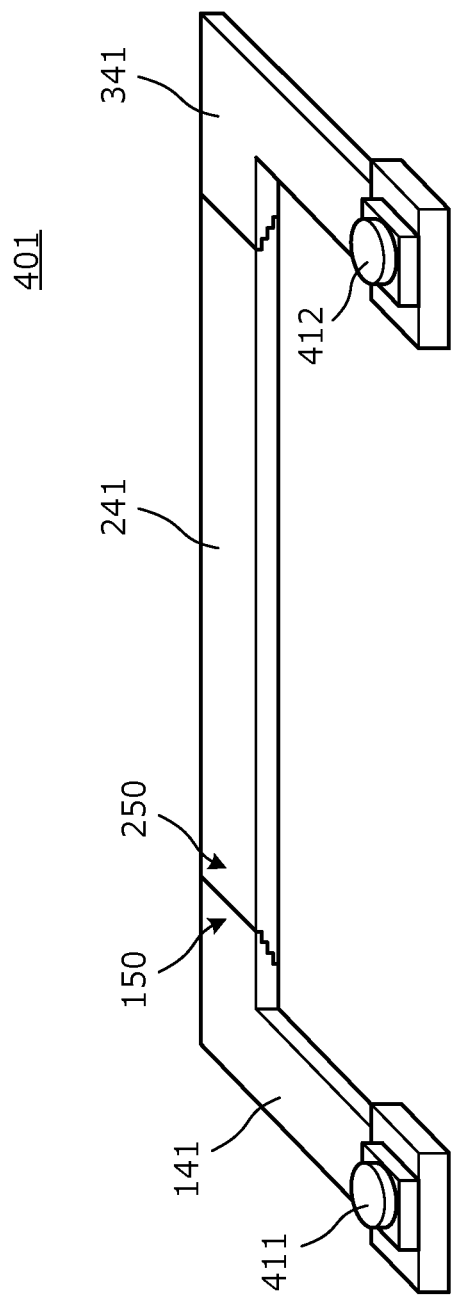
FIG. 5 is a perspective view of the transmission line cable 401 according to the first preferred embodiment of the present invention.

FIG. 5 is a perspective view of the transmission line cable 401 according to the present preferred embodiment. The transmission line cable 401 preferably includes the first transmission line 141, the second transmission line 241, and a third transmission line 341. The connecting section between the first transmission line 141 and the second transmission line 241 is described above. The transmission line cable 401 illustrated in FIG. 5 includes two of such connecting sections.

The third transmission line 341 is preferably symmetrical to the first transmission line 141 in a left-right direction. A coaxial connector 411, for example, is mounted on an end portion of the first transmission line 141. A coaxial connector 412, for example, is also mounted on an end portion of the third transmission line 341. Thus, a non-linear transmission line cable is obtained.

Figure 6A:
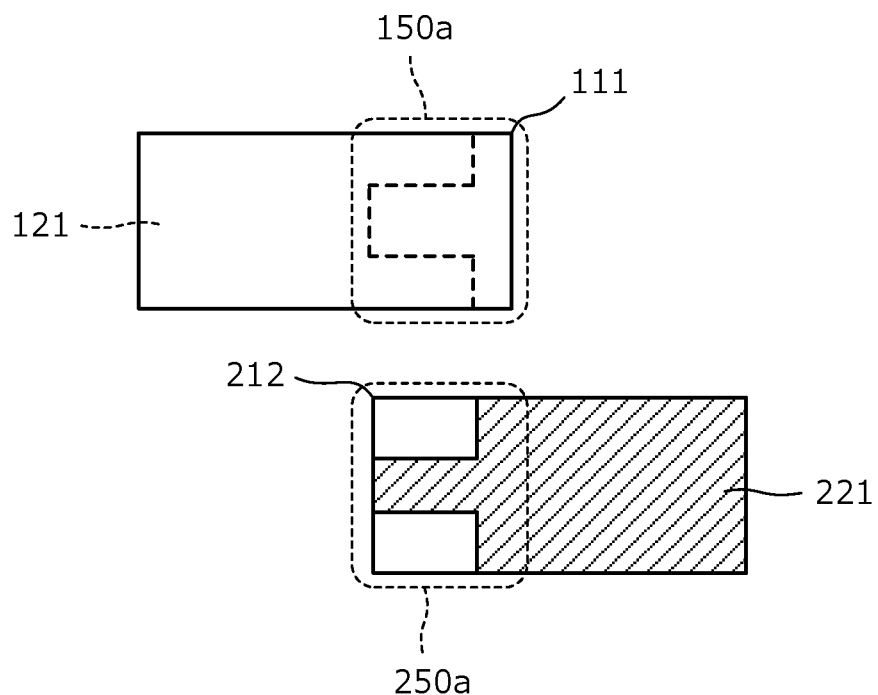
FIGS. 6A and 6B illustrate the structure of connecting portions of ground conductor patterns according to a preferred embodiment of the present invention.
Figure 6B:
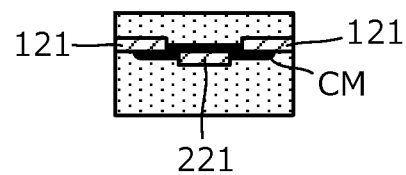

FIGS. 6A and 6B illustrate a modification of the connecting portions of the ground conductor patterns. FIG. 6A is a plan view illustrating the shape of the first ground conductor pattern 121 in the first connecting portion 150a and the shape of the third ground conductor pattern 221 in the second connecting portion 250a. FIG. 6B is a sectional view of the first connecting portion 150a and the second connecting portion 250a. As illustrated in FIGS. 6A and 6B, the planar shape of the first ground conductor pattern 121 in the first connecting portion 150a and that of the third ground conductor pattern 221 in the second connecting portion 250a fit each other. The gaps between the first ground conductor pattern 121 in the first connecting portion 150a and the third ground conductor pattern 221 in the second connecting portion 250a are filled with an electrical conductor. According to this structure, the area in which the first ground conductor pattern 121 and the third ground conductor pattern 221 overlap is reduced, so that an increase in the thickness at the first and second connecting portions is able to be reduced or prevented. A similar structure may be used for the connecting portions of the second ground conductor pattern 122 and the fourth ground conductor pattern 222. Furthermore, a similar structure may also be used for the connecting portions of the first signal conductor pattern 130 and the second signal conductor pattern 230.

Second Preferred Embodiment

In a second preferred embodiment of the present invention, an example in which two transmission lines are connected to each other to define, in particular, a corner portion of the transmission lines will be described.

Figure 8:
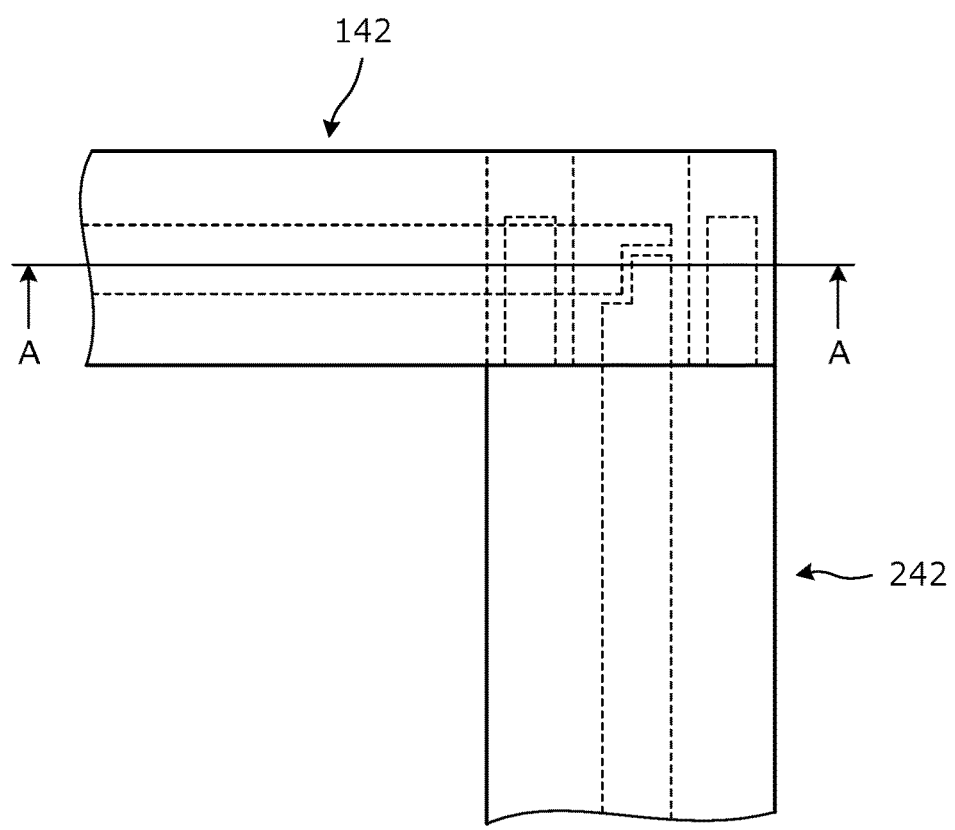
FIG. 8 is a plan view illustrating the state in which the first transmission line 142 and the second transmission line 242 are connected to each other.

FIG. 7 is a development plan view of layers included in a first transmission line 142 and a second transmission line 242, which are included in a transmission line cable according to the second preferred embodiment. FIG. 8 is a plan view illustrating the state in which the first transmission line 142 and the second transmission line 242 are connected to each other. FIGS. 9A and 9B are sectional views of the transmission line cable including the first transmission line 142 and the second transmission line 242.

The first transmission line 142 preferably includes a first multilayer insulator including insulator layers 111, 112, 113, and 114 that are stacked together, and first conductor patterns that extend along the insulator layers of the first multilayer insulator. More specifically, a first ground conductor pattern 121 is provided on the insulator layer 111, a second ground conductor pattern 122 is provided on the insulator layer 113, and a first signal conductor pattern 130 is provided on the insulator layer 112. The first conductor patterns include the first ground conductor pattern 121, the second ground conductor pattern 122, and the first signal conductor pattern 130. The insulator layer 114 is disposed below the insulator layer 113.

The second transmission line 242 preferably includes a second multilayer insulator including insulator layers 211, 212, and 213 that are stacked together, and second conductor patterns that extend along the insulator layers of the second multilayer insulator. More specifically, a third ground conductor pattern 221 is provided on the insulator layer 211, a second ground conductor pattern 222 is provided on the insulator layer 213, and a second signal conductor pattern 230 is provided on the insulator layer 212. The second conductor patterns include the third ground conductor pattern 221, the fourth ground conductor pattern 222, and the second signal conductor pattern 230.

The planar shape of the first ground conductor pattern 121 in a first connecting portion 150a and that of the third ground conductor pattern 221 in a second connecting portion 250a fit each other. The planar shape of the second ground conductor pattern 122 in a first connecting portion 150c and that of the fourth ground conductor pattern 222 in a second connecting portion 250c fit each other. Similarly, the planar shape of the first signal conductor pattern 130 in a first connecting portion 150b and that of the second signal conductor pattern 230 in a second connecting portion 250b fit each other.

FIG. 9A is a sectional view illustrating the first transmission line 142 and the second transmission line 242 before they are joined together. FIG. 9B is a sectional view taken along line A-A in FIG. 8, illustrating the first transmission line 142 and the second transmission line 242 after they are joined together. A first connecting portion 150 of the first transmission line 142 and a second connecting portion 250 of the second transmission line 242 are stacked together, and are heated and pressurized. As a result, as illustrated in FIGS. 9A and 9B, the first connecting portion 150 and the second connecting portion 250 of the first transmission line 142 and the second transmission line 242, respectively, are stacked together in such a state that the first ground conductor pattern 121 is electrically connected to the third ground conductor pattern 221, the second ground conductor pattern 122 is electrically connected to the fourth ground conductor pattern 222, and the first signal conductor pattern 130 is electrically connected to the second signal conductor pattern 230.

Figure 10:
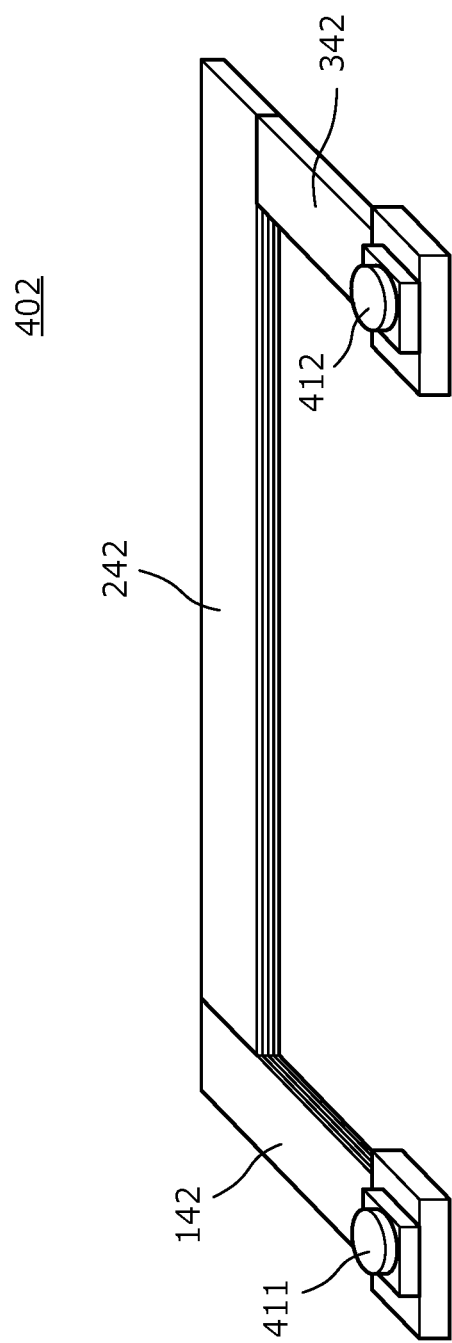
FIG. 10 is a perspective view of a transmission line cable 402 according to the second preferred embodiment of the present invention.

FIG. 10 is a perspective view of a transmission line cable 402 according to present preferred embodiment. The transmission line cable 402 preferably includes the first transmission line 142, the second transmission line 242, and a third transmission line 342. The connecting section between the first transmission line 142 and the second transmission line 242 is described above with reference to FIGS. 7 to 9B. The transmission line cable 402 illustrated in FIG. 10 includes two of such connecting sections.

The third transmission line 342 is preferably symmetrical to the first transmission line 142 in a left-right direction. A coaxial connector 411 is mounted on an end portion of the first transmission line 142. A coaxial connector 412 is mounted on an end portion of the third transmission line 342. Thus, a transmission line cable in which transmission lines are connected at corner portions thereof is obtained.

According to the present preferred embodiment, the ground conductor patterns do not have a discontinuous portion at corner portions of the transmission lines. Therefore, unnecessary radiation from the discontinuous portion does not occur.

Third Preferred Embodiment

FIGS. 11A and 11B are sectional views of a first transmission line 143 and a second transmission line 243, which are included in a transmission line cable according to a third preferred embodiment. FIG. 12 is a development plan view of layers included in the first transmission line 143 and the second transmission line 243.

The first transmission line 143 preferably includes a first multilayer insulator including insulator layers 111, 112, 113, 114, and 115 that are stacked together, and first conductor patterns that extend along the insulator layers of the first multilayer insulator. More specifically, a first ground conductor pattern 121 is provided on the insulator layer 111, a second ground conductor pattern 122 is provided on the insulator layer 115, and a first signal conductor pattern 130 is provided on the insulator layer 112. Via conductors V1 and V3 are formed in the insulator layers 111 and 113, respectively.

The above-described first conductor patterns include the first ground conductor pattern 121, the second ground conductor pattern 122, and the first signal conductor pattern 130. The insulator layer 112 is disposed between the insulator layers 111 and 113. The insulator layer 115 is disposed below the insulator layer 114.

The second transmission line 243 preferably includes a second multilayer insulator including insulator layers 211, 212, 213, 214, and 215 that are stacked together, and second conductor patterns that extend along the insulator layers of the second multilayer insulator. More specifically, a third ground conductor pattern 221 is provided on the insulator layer 212, a fourth ground conductor pattern 222 is provided on the insulator layer 215, and a second signal conductor pattern 230 is provided on the insulator layer 214. A via conductor V2 is formed in the insulator layer 215.

The second conductor patterns include the third ground conductor pattern 221, the fourth ground conductor pattern 222, and the second signal conductor pattern 230. The insulator layer 213 is disposed between the insulator layers 212 and 214. The insulator layer 211 is disposed above the insulator layer 212.

When a thermocompression bonding process is not yet performed, the via conductors V1, V2, and V3 are in the form of conductive paste with which openings are filled.

The first transmission line 143 includes a first connecting portion 150 that is connected to the second transmission line 243. The second transmission line 243 includes a second connecting portion 250 that is connected to the first transmission line 143.

In the first connecting portion 150, the first signal conductor pattern 130 projects beyond the second ground conductor pattern 122, and the first ground conductor pattern 121 projects beyond the first signal conductor pattern 130 and the second ground conductor pattern 122.

In the second connecting portion 250, the second signal conductor pattern 230 projects beyond the third ground conductor pattern 221, and the fourth ground conductor pattern 222 projects beyond the second signal conductor pattern 230 and the third ground conductor pattern 221.

Thus, the first connecting portion 150 and the second connecting portion 250 both have a stepped shape.

FIG. 11A is a sectional view illustrating the first transmission line 143 and the second transmission line 243 before they are joined together (when they are simply stacked), and FIG. 11B illustrates the first transmission line 143 and the second transmission line 243 after they are joined together. The first connecting portion 150 of the first transmission line 143 and the second connecting portion 250 of the second transmission line 243 are stacked together, and are subjected to the thermocompression bonding process. As a result, the above-described via conductors V1, V2, and V3 are solidified and become conductive. In addition, the adjacent insulator layers (thermoplastic resin sheets made of LCP or PI) are integrated together by being fusion bonded to each other.

As illustrated in FIGS. 11A and 11B, the first connecting portion 150 and the second connecting portion 250 of the first transmission line 143 and the second transmission line 243, respectively, are stacked together in such a state that the first ground conductor pattern 121 is electrically connected to the third ground conductor pattern 221 by the via conductor V1, the second ground conductor pattern 122 is electrically connected to the fourth ground conductor pattern 222 by the via conductor V2, and the first signal conductor pattern 130 is electrically connected to the second signal conductor pattern 230 by the via conductor V3.

According to the present preferred embodiment, the ground conductor patterns do not have a discontinuous portion. Therefore, unnecessary radiation from the discontinuous portion does not occur.

Fourth Preferred Embodiment

Figure 13:
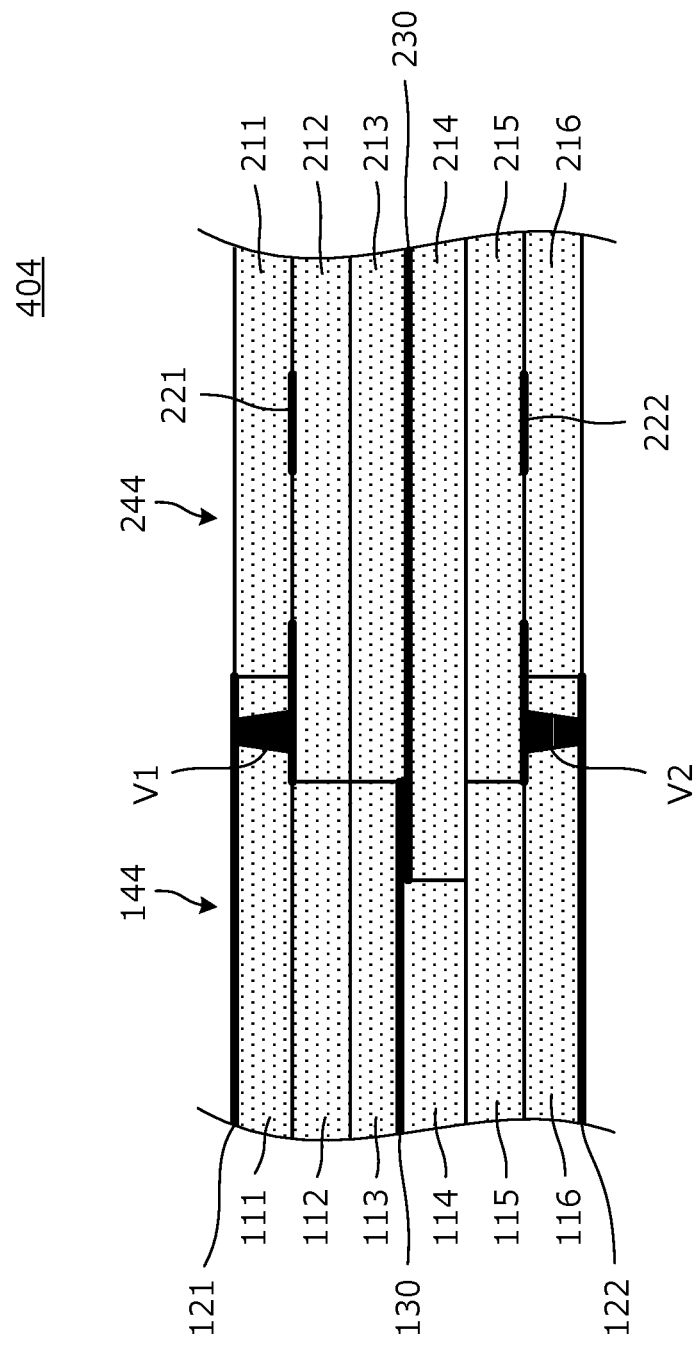
FIG. 13 is a sectional view of a transmission line cable 404 according to a fourth preferred embodiment of the present invention.
Figure 14:
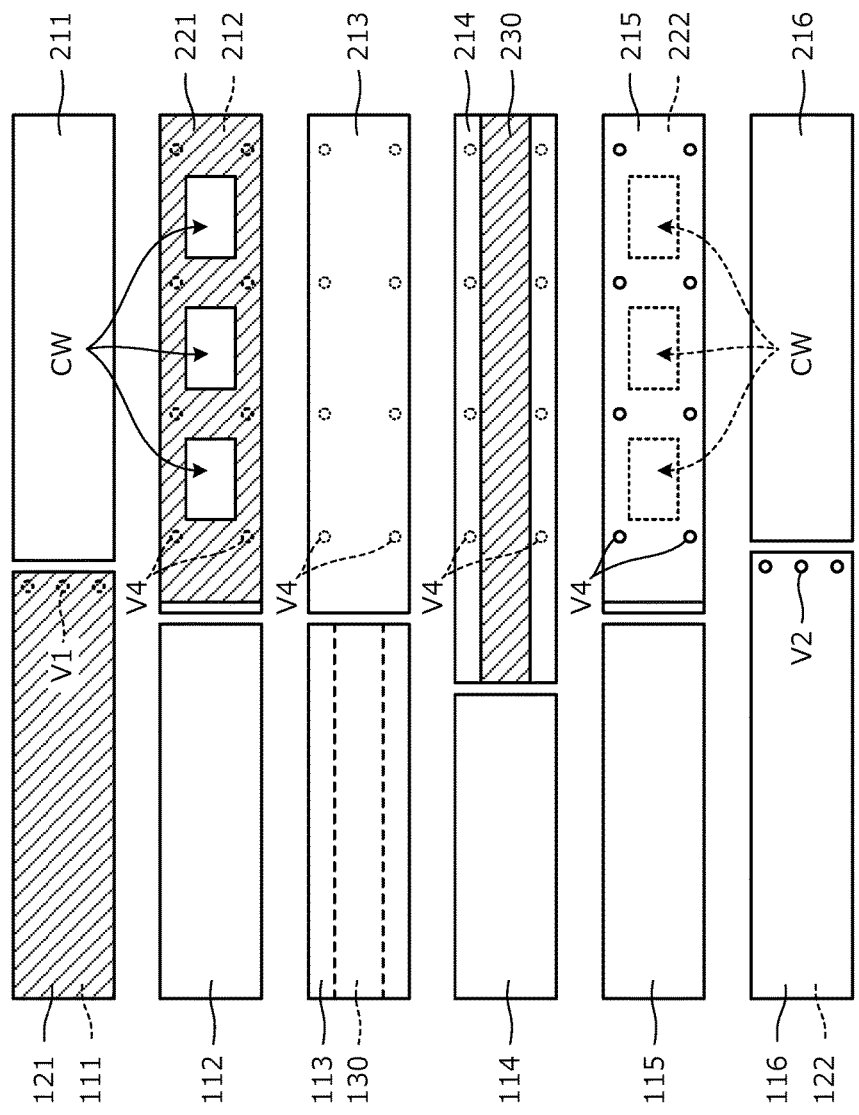
FIG. 14 is a development plan view of layers included in a first transmission line 144 and a second transmission line 244.
Figure 15:
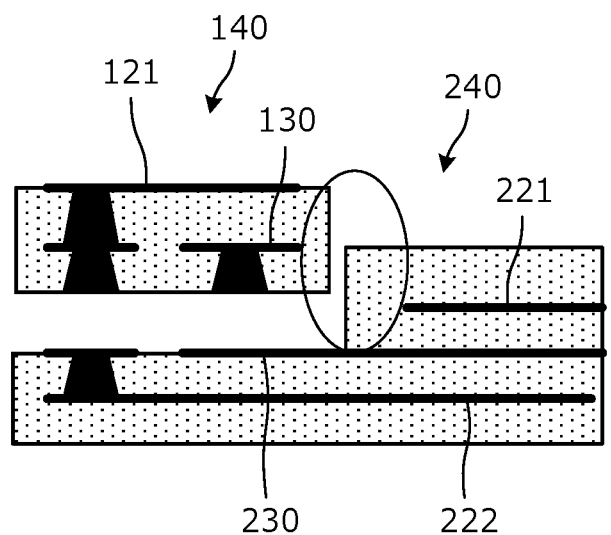
FIG. 15 is a sectional view of a portion of a transmission line cable in which two transmission lines 140 and 240 are connected and has a structure according to International Publication No. 2014/069095.

FIG. 13 is a sectional view of a transmission line cable 404 according to a fourth preferred embodiment of the present invention. FIG. 14 is a development plan view of layers included in a first transmission line 144 and a second transmission line 244.

The first transmission line 144 preferably includes a first multilayer insulator including insulator layers 111 to 116 that are stacked together, and first conductor patterns that extend along the insulator layers of the first multilayer insulator. More specifically, a first ground conductor pattern 121 is provided on the insulator layer 111, a second ground conductor pattern 122 is provided on the insulator layer 116, and a first signal conductor pattern 130 is provided on the insulator layer 113. Via conductors V1 and V2 are provided in the insulator layers 111 and 116, respectively.

The above-described first conductor patterns include the first ground conductor pattern 121, the second ground conductor pattern 122, and the first signal conductor pattern 130. The insulator layer 112 is disposed between the insulator layers 111 and 113. The insulator layers 114 and 115 are disposed between the insulator layers 113 and 116.

The second transmission line 244 preferably includes a second multilayer insulator including insulator layers 211 to 216 that are stacked together, and second conductor patterns that extend along the insulator layers of the second multilayer insulator. More specifically, a third ground conductor pattern 221 is provided on the insulator layer 212, a fourth ground conductor pattern 222 is provided on the insulator layer 215, and a second signal conductor pattern 230 is provided on the insulator layer 214.

The second conductor patterns include the third ground conductor pattern 221, the fourth ground conductor pattern 222, and the second signal conductor pattern 230. The insulator layer 213 is disposed between the insulator layers 212 and 214. The insulator layer 211 is disposed above the insulator layer 212. The insulator layer 216 is disposed below the insulator layer 215.

As illustrated in FIG. 14, each of the third ground conductor pattern 221 and the fourth ground conductor pattern 222 preferably includes conductor-free portions (conductor windows) CW arranged at a predetermined pitch. A plurality of via conductors V4 provide an interlayer connection between the third ground conductor pattern 221 and the fourth ground conductor pattern 222. The via conductors V4 are arranged on both sides of the second signal conductor pattern 230.

According to the present preferred embodiment, the capacitance between the third ground conductor pattern 221 and the second signal conductor pattern 230 and the capacitance between the fourth ground conductor pattern 222 and the second signal conductor pattern 230 are reduced. Therefore, the third ground conductor pattern 221 and the fourth ground conductor pattern 222 can be disposed on layers on the inner sides of the first ground conductor pattern 121 and the second ground conductor pattern 122. As a result, the thickness of the transmission line cable is able to be reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line cable comprising:
a first transmission line including a first multilayer insulator and first conductor patterns, the first multilayer insulator including a plurality of insulator layers that are stacked together, the first conductor patterns being disposed in or on the first multilayer insulator and extending along the insulator layers of the first multilayer insulator; and
a second transmission line including a second multilayer insulator and second conductor patterns, the second multilayer insulator including a plurality of insulator layers that are stacked together, the second conductor patterns being disposed in or on the second multilayer insulator and extending along the insulator layers of the second multilayer insulator; wherein
the first conductor patterns include a first ground conductor pattern, a second ground conductor pattern, and a first signal conductor pattern disposed between the first ground conductor pattern and the second ground conductor pattern in a stacking direction;
the second conductor patterns include a third ground conductor pattern, a fourth ground conductor pattern, and a second signal conductor pattern disposed between the third ground conductor pattern and the fourth ground conductor pattern in the stacking direction;
in a first connecting portion of the first transmission line that is connected to the second transmission line, the first signal conductor pattern projects beyond the second ground conductor pattern in a direction in which the first signal conductor pattern extends, and the first ground conductor pattern projects beyond the first signal conductor pattern and the second ground conductor pattern in a direction in which the first ground conductor pattern extends;

in a second connecting portion of the second transmission line that is connected to the first transmission line, the second signal conductor pattern projects beyond the third ground conductor pattern in a direction in which the second signal conductor pattern extends, and the fourth ground conductor pattern projects beyond the second signal conductor pattern and the third ground conductor pattern in a direction in which the fourth ground conductor pattern extends;

in a state in which the first connecting portion and the second connecting portion are stacked together, the first ground conductor pattern is electrically connected to the third ground conductor pattern, the second ground conductor pattern is electrically connected to the fourth ground conductor pattern, and the first signal conductor pattern is electrically connected to the second signal conductor pattern;

in the state in which the first connecting portion and the second connecting portion are stacked together, the first signal conductor pattern and the second signal conductor pattern are disposed between a pair of ground conductor patterns defined by the first ground conductor pattern and the third ground conductor pattern and a pair of ground conductor patterns defined by the second ground conductor pattern and the fourth ground conductor pattern in the stacking direction; and a width of the first signal conductor pattern in the first connecting portion differs from a width of the second signal conductor pattern in the second connecting portion.

2. The transmission line cable according to claim 1, wherein a portion of the first signal conductor pattern in the first connecting portion and a portion of the second signal conductor pattern in the second connecting portion do not overlap in plan view, and a gap between the first signal conductor pattern and the second signal conductor pattern is filled with a conductor.

3. The transmission line cable according to claim 1, wherein a portion of the first ground conductor pattern in the first connecting portion and a portion of the third ground conductor pattern in the second connecting portion do not overlap in plan view, and a gap between the first ground conductor pattern and the third ground conductor pattern is filled with a conductor; and a portion of the second ground conductor pattern in the first connecting portion and a portion of the fourth ground conductor pattern in the second connecting portion do not overlap in plan view, and a gap between the second ground conductor pattern and the fourth ground conductor pattern is filled with a conductor.

4. The transmission line cable according to claim 1, wherein the plurality of insulator layers of the first multilayer insulator and the plurality of insulator layers of the second multiplayer insulator are made of a thermoplastic resin, and are fusion-bonded in the state in which the first connecting portion and the second connecting portion are stacked together.

5. The transmission line cable according to claim 1, wherein each of the third ground conductor pattern and the fourth ground conductor pattern include conductor-free portions provided at a predetermined pitch.

6. The transmission line cable according to claim 1, wherein the third ground conductor pattern and the fourth ground conductor pattern are electrically connected to one another through a plurality of via conductors.

7. The transmission line cable according to claim 1, further comprising a third transmission line including a third multilayer insulator including a plurality of insulator layers, a third signal conductor pattern electrically connected to the second signal conductor, a fifth ground conductor pattern electrically connected to the third ground conductor pattern, and a sixth ground conductor pattern electrically connected to the fourth ground conductor pattern.

8. The transmission line cable according to claim 1, wherein a region in which the first signal conductor pattern and the second signal conductor pattern are electrically connected to each other overlaps at least one of the first ground conductor pattern, the second ground conductor pattern, the third ground conductor pattern, and the fourth ground conductor pattern in plan view.

9. The transmission line cable according to claim 8, wherein a planar shape of the first signal conductor pattern in the first connecting portion and a planar shape of the second signal conductor pattern in the second connecting portion fit each other, and a gap between the first signal conductor pattern and the second signal conductor pattern is filled with a conductor.

10. The transmission line cable according to claim 8, wherein a planar shape of the first ground conductor pattern in the first connecting portion and a planar shape of the third ground conductor pattern in the second connecting portion fit each other, and a gap between the first ground conductor pattern and the third ground conductor pattern is filled with a conductor; and a planar shape of the second ground conductor pattern in the first connecting portion and a planar shape of the fourth ground conductor pattern in the second connecting portion fit each other, and a gap between the second ground conductor pattern and the fourth ground conductor pattern is filled with a conductor.

11. A transmission line cable comprising:

a first transmission line including a first multilayer insulator and first conductor patterns, the first multilayer insulator including a plurality of insulator layers that are stacked together, the first conductor patterns being disposed in or on the first multilayer insulator and extending along the insulator layers of the first multilayer insulator; and a second transmission line including a second multilayer insulator and second conductor patterns, the second multilayer insulator including a plurality of insulator layers that are stacked together, the second conductor patterns being disposed in or on the second multilayer insulator and extending along the insulator layers of the second multilayer insulator; wherein the first conductor patterns include a first ground conductor pattern, a second ground conductor pattern, and a first signal conductor pattern disposed between the first ground conductor pattern and the second ground conductor pattern in a stacking direction;

the second conductor patterns include a third ground conductor pattern, a fourth ground conductor pattern, and a second signal conductor pattern disposed between the third ground conductor pattern and the fourth ground conductor pattern in the stacking direction;

in a first connecting portion of the first transmission line that is connected to the second transmission line, the first signal conductor pattern projects beyond the second ground conductor pattern in a direction in which the first signal conductor pattern extends, and the first ground conductor pattern projects beyond the first signal conductor pattern and the second ground conductor pattern in a direction in which the first ground conductor pattern extends;

in a second connecting portion of the second transmission line that is connected to the first transmission line, the second signal conductor pattern projects beyond the third ground conductor pattern in a direction in which the second signal conductor pattern extends, and the fourth ground conductor pattern projects beyond the second signal conductor pattern and the third ground conductor pattern in a direction in which the fourth ground conductor pattern extends;

in a state in which the first connecting portion and the second connecting portion are stacked together, the first ground conductor pattern is electrically connected to the third ground conductor pattern, the second ground conductor pattern is electrically connected to the fourth ground conductor pattern, and the first signal conductor pattern is electrically connected to the second signal conductor pattern;

in the state in which the first connecting portion and the second connecting portion are stacked together, the first signal conductor pattern and the second signal conductor pattern are disposed between a pair of ground conductor patterns defined by the first ground conductor pattern and the third ground conductor pattern and a pair of ground conductor patterns defined by the second ground conductor pattern and the fourth ground conductor pattern in the stacking direction; and a width of the first ground conductor pattern in the first connecting portion differs from a width of the third ground conductor pattern in the second connecting portion, and a width of the second ground conductor pattern in the first connecting portion differs from a width of the fourth ground conductor pattern in the second connecting portion.

12. The transmission line cable according to claim 11, wherein a portion of the first signal conductor pattern in the first connecting portion and portion of the second signal conductor pattern in the second connecting portion do not overlap in plan view, and a gap between the first signal conductor pattern and the second signal conductor pattern is filled with a conductor.

13. The transmission line cable according to claim 11, wherein a portion of the first ground conductor pattern in the first connecting portion and portion of the third ground conductor pattern in the second connecting portion do not overlap in plan view, and a gap between the first ground conductor pattern and the third ground conductor pattern is filled with a conductor; and a portion of the second ground conductor pattern in the first connecting portion and a portion of the fourth ground conductor pattern in the second connecting portion do not overlap in plan view, and a gap between the second ground conductor pattern and the fourth ground conductor pattern is filled with a conductor.

14. The transmission line cable according to claim 11, wherein the plurality of insulator layers of the first multilayer insulator and the plurality of insulator layers of the second multiplayer insulator are made of a thermoplastic resin, and are fusion-bonded in the state in which the first connecting portion and the second connecting portion are stacked together.

15. The transmission line cable according to claim 11, wherein each of the third ground conductor pattern and the fourth ground conductor pattern include conductor-free portions provided at a predetermined pitch.

16. The transmission line cable according to claim 11, wherein the third ground conductor pattern and the fourth ground conductor pattern are electrically connected to one another through a plurality of via conductors.

17. The transmission line cable according to claim 11, further comprising a third transmission line including a third multilayer insulator including a plurality of insulator layers, a third signal conductor pattern electrically connected to the second signal conductor, a fifth ground conductor pattern electrically connected to the third ground conductor pattern, and a sixth ground conductor pattern electrically connected to the fourth ground conductor pattern.

18. The transmission line cable according to claim 11, wherein a region in which the first signal conductor pattern and the second signal conductor pattern are electrically connected to each other overlaps at least one of the first ground conductor pattern, the second ground conductor pattern, the third ground conductor pattern, and the fourth ground conductor pattern in plan view.

19. The transmission line cable according to claim 18, wherein a planar shape of the first signal conductor pattern in the first connecting portion and a planar shape of the second signal conductor pattern in the second connecting portion fit each other, and a gap between the first signal conductor pattern and the second signal conductor pattern is filled with a conductor.

20. The transmission line cable according to claim 18, wherein a planar shape of the first ground conductor pattern in the first connecting portion and a planar shape of the third ground conductor pattern in the second connecting portion fit each other, and a gap between the first ground conductor pattern and the third ground conductor pattern is filled with a conductor; and a planar shape of the second ground conductor pattern in the first connecting portion and a planar shape of the fourth ground conductor pattern in the second connecting portion fit each other, and a gap between the second ground conductor pattern and the fourth ground conductor pattern is filled with a conductor.

* * * * *